US010897239B1

(12) United States Patent
Saetow et al.

(10) Patent No.: US 10,897,239 B1
(45) Date of Patent: Jan. 19, 2021

(54) GRANULAR VARIABLE IMPEDANCE TUNING

(71) Applicant: INTERNATIONAL BUSINESS MACHINES CORPORATION, Armonk, NY (US)

(72) Inventors: Anuwat Saetow, Austin, TX (US); David D. Cadigan, Danbury, CT (US); William V. Huott, Holmes, NY (US); Adam J. McPadden, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/563,104

(22) Filed: Sep. 6, 2019

(51) Int. Cl.
| H03H 7/40 | (2006.01) |
| H03H 11/28 | (2006.01) |
| H03H 11/26 | (2006.01) |
| H03H 11/16 | (2006.01) |

(52) U.S. Cl.
CPC ............ *H03H 11/28* (2013.01); *H03H 7/40* (2013.01); *H03H 11/16* (2013.01); *H03H 11/26* (2013.01)

(58) Field of Classification Search
CPC . H03H 7/38; H03H 7/40; H03H 11/28; H03H 11/16; H03H 11/18; H03H 11/26; H03H 11/30
See application file for complete search history.

(56) References Cited

U.S. PATENT DOCUMENTS

| 6,605,958 | B2 | 8/2003 | Bergman et al. |
| 7,342,412 | B2 | 3/2008 | Kim |
| 7,640,468 | B2 | 12/2009 | Linam et al. |
| 7,791,057 | B2 | 9/2010 | Lung et al. |
| 7,915,913 | B2 | 3/2011 | Nakata |
| 8,169,233 | B2 | 5/2012 | Ferolito et al. |
| 8,183,551 | B2 | 5/2012 | Kordus et al. |
| 8,222,917 | B2 | 7/2012 | Oliva et al. |
| 8,274,308 | B2 | 9/2012 | McCall |
| 8,494,775 | B2 | 7/2013 | Parsche |
| 9,118,313 | B2 | 8/2015 | Lee et al. |

(Continued)

OTHER PUBLICATIONS

Keller, "Managing signal integrity in tomorrow's high-speed lash-memory-system designs", EDN, Jan. 20, 2011, US.

(Continued)

*Primary Examiner* — Stephen E. Jones
(74) *Attorney, Agent, or Firm* — Gregory M. Nordstrom

(57) ABSTRACT

A method comprises activating an interval timer to expire in a calibration time interval and, in response to the timer expiring, performing an impedance analysis of an electronic network. The impedance analysis can use time-domain reflectometry. Based on the analysis, the method can calibrate a variable impedance device to have a first impedance and re-activate the timer. The method can perform a second impedance analysis based on calibrating the variable impedance device. The method can include determining a drift rate and modifying the calibration time interval. The variable impedance device can comprise a phase-change material (PCM), and the time interval can correspond to a retention time of the PCM and/or a dynamic drift rate. A system comprising a segment of an electronic network, a timer, a variable impedance device, and an impedance tuning system can embody operations of the method.

20 Claims, 7 Drawing Sheets

(56) References Cited

U.S. PATENT DOCUMENTS

| | | |
|---|---|---|
| 9,210,257 B2 | 12/2015 | Hall et al. |
| 9,546,895 B2 | 1/2017 | Flasza et al. |
| 2007/0024327 A1 | 2/2007 | Howe et al. |
| 2009/0016124 A1 | 1/2009 | Kim |
| 2011/0014886 A1* | 1/2011 | Manssen .................. H03H 7/40 |
| | | 455/121 |
| 2013/0261977 A1 | 10/2013 | Shanks |
| 2014/0016686 A1 | 1/2014 | Artsi |
| 2019/0214232 A1* | 7/2019 | Morii ....................... H03H 7/54 |

OTHER PUBLICATIONS

Zhang, et al, "A non-destructive method to measure the thermal properties of frozen soils during phase transition", Journal of Rock Mechanics and Geotechnical Engineering 7, 2015, pp. 155-162, US.
Liu, et al, "Time domain reflectometry sensor-assisted freeze/thaw analysis in geomaterials", Cold Regions Science and Technology 7, 2012, pp. 84-89, US.

* cited by examiner

US 10,897,239 B1

GRANULAR VARIABLE IMPEDANCE TUNING

BACKGROUND

The present disclosure relates to tuning impedance of an electrical circuit, and more specifically, to tuning impedance of an electrical circuit that can include on-die termination of circuits of integrated circuits.

SUMMARY

According to embodiments of the present disclosure (hereinafter, "the disclosure"), a method can calibrate an impedance of a variable impedance device. In embodiments of the disclosure (hereinafter, "embodiments"), the method comprises activating an interval timer to expire after a calibration interval. In response to the timer expiring, the method performs an impedance analysis of the network and, based on the analysis, the method calibrates a variable impedance device to have a first impedance and re-activates the timer to expire after the calibration interval time period. In embodiments, the method can include performing a second impedance analysis and, based on that analysis, calibrating the variable impedance device to have a second impedance. In embodiments one or both of the first and second impedance analyses can comprise a time-domain reflectometry (TDR) analysis.

In embodiments the variable impedance device can comprise a phase-change material (PCM) and calibrating the variable impedance device can comprise modifying the PCM to produce the first impedance of the variable impedance device. The calibration interval time period can correspond to a retention time of the PCM. The method can also include determining a drift rate, modifying the calibration interval based on the drift rate, and re-activating the interval timer using the modified calibration interval.

A system can embody operations of the method. In embodiments the system can comprise a segment of an electronic network, an interval timer, a variable impedance device, and an impedance tuning system. The impedance tuning system can perform operations of the method. In embodiments, the impedance tuning system can include a TDR circuit, and the impedance tuning system can perform the impedance analysis using the TDR circuit to perform TDR operations of the analysis.

In embodiments, the variable impedance device of the system can comprise a PCM, and the impedance tuning system can calibrate the variable impedance device by modifying the PCM, based on a result of the TDR analysis, to produce the first impedance of the variable impedance device. The calibration interval can correspond to a retention time of the PCM. The system can further include a monitor circuit that can determine a drift rate and the impedance tuning system can modify the calibration interval based on the drift rate. The impedance tuning system can re-activate the interval timer using the modified calibration interval.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure (hereinafter, "the disclosure) and, along with the description, serve to explain the principles of the disclosure. The drawings are only illustrative of certain embodiments and do not limit the disclosure.

Figure 1A:
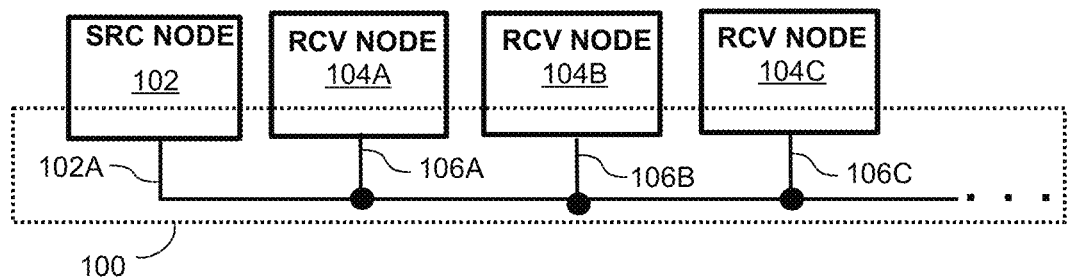
FIG. 1A illustrates an example electronic network, according to aspects of the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the disclosure.

DETAILED DESCRIPTION

Aspects of the present disclosure (hereinafter, "the disclosure") relate to tuning impedance of an electrical circuit. More particular aspects relate to tuning impedance of an electrical circuit associated with a segment of an electronic network, such as an electronic network including on-die termination (ODT) of an Integrated Circuit (IC). While the disclosure is not necessarily limited to such applications, various aspects of the disclosure may be appreciated through a discussion of various examples using this context.

An electronic network (hereinafter, "net") can comprise one or more "nodes" having electronic devices that can electrically interconnect the nodes within the network. As used herein, "electronic device" refers interchangeably to any form of electrical and/or electronic device, and/or electronic circuit comprising such devices, not limited to a particular electrical devices and/or configuration of electronic devices forming an electronic circuit.

In embodiments of the disclosure (hereinafter, "embodiments"), nodes of a net can comprise electronic "functional" and/or "circuit" devices that can perform particular operations of an electronic system. For example, in embodiments functional devices of a node can comprise processors, memories, memory cells, and/or memory controllers of a computing system; and/or clocking, input/output, control, sequencing, and/or combinatorial devices of a digital logic circuit. Such functional devices can include, and/or can be coupled to, circuit devices of a node, and circuit devices of a node can electrically couple the node to a network. In embodiments, such circuit devices can comprise, for example, transistors, resistors, capacitors, inductors, electronic drivers, electronic receivers, electronic transceivers, and/or, circuits formed of such devices. As used herein, "node" encompasses any combination of functional and/or circuit devices of an electronic circuit capable of electrically coupling to a net.

In embodiments a net can further comprise one or more "signal lines" electrically interconnecting circuit devices of the nodes to form the net. Signal lines in an embodiment can comprise any form of electronic wires, "traces" and/or "lines", such as can be soldered on an electronic circuit board and/or fabricated in a printed circuit board (PCB) and/or a semiconductor IC. As used herein, "signal line" refers to any form of electrically conductive wires, traces, lines, and/or other form of electrical signal path, that can electrically interconnect circuit devices of nodes of a net.

Such signal lines can operate, in embodiments, to transmit electronic signals among nodes of a net. "Electronic signals", as used herein, refers to any form of electrical transmission conducted on an electrically conductive path between two or more electronic devices (e.g., circuit devices of a network node), such as direct current (DC) and/or alternating current (AC) electrical waveforms (e.g., digital pulse or sinusoidal waveforms). In embodiments, a "source" device of a net can transmit electronic signals to one or more "receiving devices" of a net. As also used herein, "network signal" refers to any such electronic signal transmitted and/or received by circuit devices of nodes of a net on signal lines of that net.

In embodiments, a "segment" of a net can comprise circuit devices of a node and signal lines electrically coupling the circuit devices to, and/or within, a net. As used herein, signal lines "emanating" from a node refers to signal lines of a net that originate from, and/or terminate at, circuit devices of a particular node to electrically couple that node to a net. Accordingly, as used herein, a "segment" of a net comprises any combination of circuit devices of a node and signal lines emanating from those circuit devices to electrically connect a node to a net.

To illustrate, FIG. 1A depicts example net 100, comprising SRC NODE 102 and RCV NODE 104A. 104B, and 104C, connected in net 100 by means of respective segments 102A (emanating from SRC NODE 102), 106A (emanating from RCV NODE 104A), 106B (emanating from RCV NODE 104B), and 106C (emanating from RCV NODE 104C). In embodiments, the segments can comprise circuit devices and/or signal lines emanating from the respective nodes. While not shown in the example of FIG. 1A, it would be apparent to one of ordinary skill in the art that, in embodiments, a net can comprise as few as two nodes, or can comprise more nodes than illustrated by the example of FIG. 1A.

In embodiments, a "source node" can be, for example, a node that can control, transmit, and/or receive network signals transmitted between nodes of a net, and a "receiving node" of a net can be, for example, a node that can receive a network signal. In FIG. 1A, SRC NODE 102 can be considered a source node and RCV NODEs 104A, 104B, and/or 140C can be considered receiving nodes. In an embodiment a source node can comprise, for example, a processor, and/or memory controller, and a receiving node can comprise a memory device (e.g., a memory IC).

In embodiments, a net, and/or segments of a net, can have electrical characteristics of electrical transmission lines. In particular, in embodiments a net can exhibit reduced network signal quality (e.g., waveform phase and/or shape distortion, and/or loss of waveform amplitude) based on electrical characteristics of one or more segments of the net. For example, in embodiments, differing, or "non-uniform", electrical impedances among segments of a net can cause "reflections" of network signals transmitted on the net that can reduce the quality of such network signals. For example, a net can comprise a plurality of ICs of a PCB, and the ICs can be, or can include, nodes of a net electrically coupled by segments of the net. Non-uniform impedance among the segments can reduce the quality of a network signal transmitted on that net. ICs, and/or PCBs interconnecting ICs, particularly in nets having complex segment and/or circuit device topologies.

Accordingly, "tuning" impedances of segments of a net, to produce more uniform impedances among the segments, can reduce or eliminate network signal reflections on the net. For example, a method of tuning impedance of segments of a net in IC applications uses ODT circuits, included on the die of an IC, to tune impedance of segments of a net that includes circuit devices, and/or signal lines, of the IC.

Figure 1B:
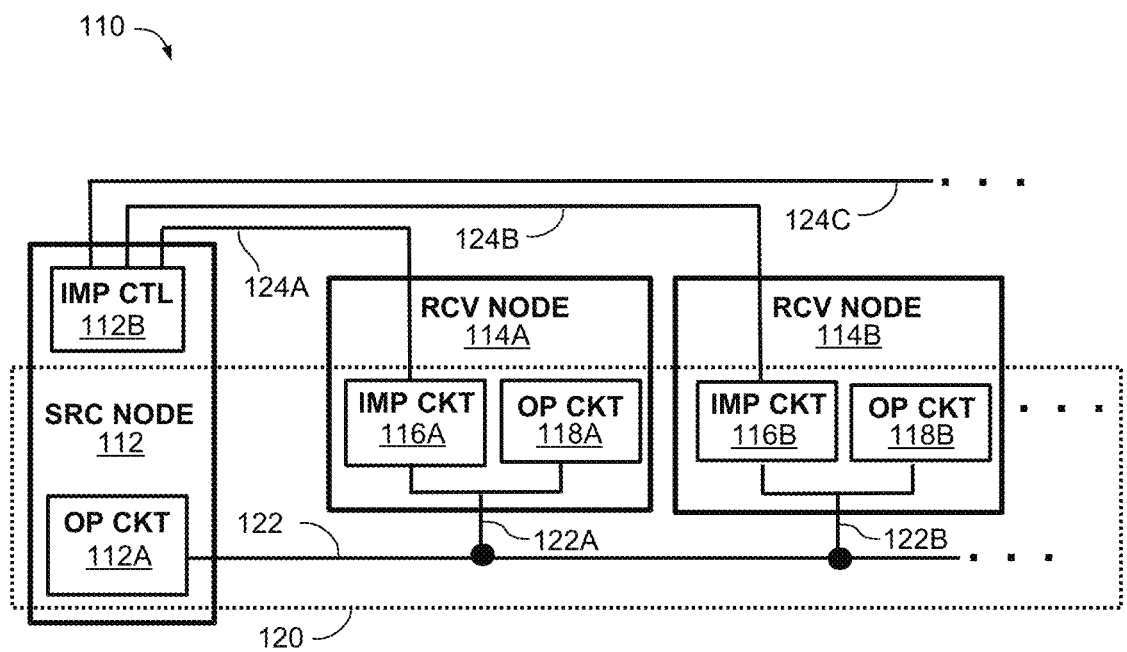
FIG. 1B illustrates an example impedance tuning system, according to aspects of the disclosure.

FIG. 1B illustrates an example electronic circuit, which can be similar to the example of FIG. 1A and that can include an ODT circuit in, and/or associated with, a node of a net. In FIG. 1B, circuit 110 comprises node SRC NODE 112 and RCV NODE 114A and 114B, electrically coupled by segments 122, 122A and 122B, respectively, included in net 120. In an embodiment, RCV NODE 114A and/or 114B can include, for example, functional and/or circuit devices of an IC and/or PCB (not shown in FIG. 1), such as memory cells of a dynamic random access memory (DRAM). SRC NODE 112 can be, for example, a memory controller (and/or, a processor) that can control perform write and/or read operations, on net 120, to memory devices included in RCV NODE 114A and/or 114B.

FIG. 1B further depicts RCV NODE 114A and 114B each including operational circuits OP CKT 118A and 118B, respectively. In an embodiment, OP CKT 118A and/or 118B can include circuit devices, such as previously described, of RCV NODE 114A and/or 114B, respectively, and circuit devices can electrically connect OP CKT 118A and/or 118B to respective segments 122A and 122B. Similarly, FIG. 1B illustrates SRC NODE 112 including OP CKT 112A, which can include circuit devices, similar to those just described in reference to OP CKT 118A and 118B.

FIG. 1B also depicts RCV NODE 114A and 114B including impedance circuits IMP CKT 116A and 116B, respectively. In embodiments, RCV NODE 114A and/or 114B can be included in an IC and, accordingly, IMP CKT 116A and/or 116B can be, for example, ODT circuits of such an IC. In embodiments, impedance circuits, such as IMP CKT 116A and/or 116B can include impedance devices to tune (e.g., match) impedances among segments of net 120 and, thereby, reduce network signal distortions on net 120. As used herein, "impedance device" refers to any form of electronic device, and/or circuit of such devices, that has an electrical impedance.

In FIG. 1B SRC NODE 112 further includes impedance controller IMP CTL 112B connecting to IMP CKT 116A and 116B, respectively, by means of respective connections 124A and 124B. In an embodiment, connection 124C can further connect IMP CKT 112B to impedance circuits, such as 116A or 116B, included in one or more additional nodes (not shown in FIG. 1B) of net 120. In embodiments, an impedance controller can use a connection to an impedance circuit to connect an impedance device to a segment of a net, and/or disconnect an impedance device from a segment of a net.

For example, in FIG. 1B IMP CTL 112B can use connection 124A to connect an impedance device, included in IMP CKT 116A, to segment 122A and, by connecting the device to segment 122A, can include an impedance of that device in an impedance of net 120. Similarly, IMP CTL 112B can use connection 124A to disconnect an impedance device, included in IMP CKT 116A, from segment 122A and, by disconnecting the device from segment 122A, can exclude an impedance of that device from net 120. While not shown in FIG. 1B, in an embodiment SRC NODE 112 can include an impedance circuit, such as the example of IMP CKT 116A, and IMP CTL 112B can use such an impedance circuit to tune an impedance of net 120 (e.g., by connecting an impedance device to, or disconnecting the device from, segment 122).

Figure 1C:
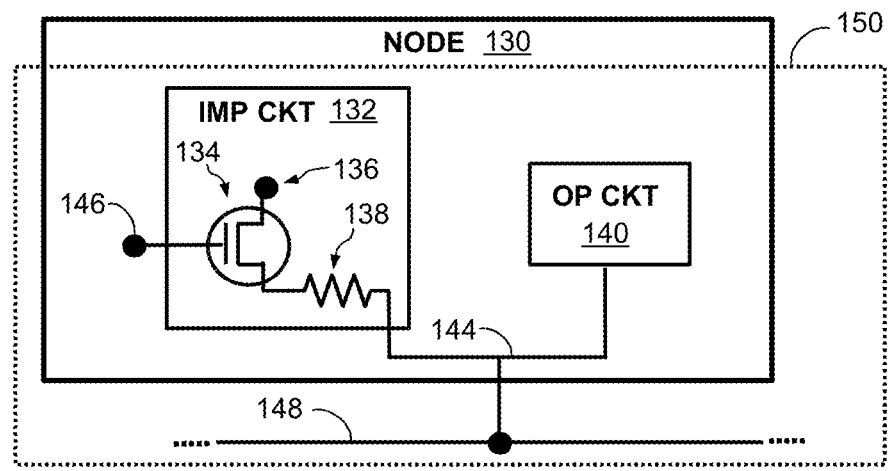
FIG. 1C illustrates an example impedance circuit, according to aspects of the disclosure.

FIG. 1C illustrates details of an example impedance circuit such as 116A and/or 116B of FIG. 1B. As shown in FIG. 1C, net 150 comprises segments 148 and 144, and OP CKT 140 and IMP CKT 132 of NODE 130. In an embodiment, IMP CKT 132 can be an impedance circuit and OP CKT 140 can comprise, for example, functional and/or circuit devices of NODE 130. Segment 144 can electrically couple circuit devices of NODE 130 (e.g., circuit devices of OP CKT 140 and/or IMP CKT 132) to segment 148 within net 150. While not shown in FIG. 1C, net 150 can include additional nodes, and respective segments coupling those nodes to net 150 (e.g., coupling those nodes to segment 148 of net 150), and the additional nodes can have structures similar to that of NODE 130.

As shown in FIG. 1C, IMP CKT 132 includes resistor 138 and transistor 134. In an embodiment, resistor 138 can be an impedance device of IMP CKT 132 and transistor 134 can operate, in IMP CKT 132, to include the impedance of resistor 138 in segment 144 and/or exclude the impedance of resistor 138 from segment 144. For example, in an embodiment, contact 136 can connect transistor 134 to a DC voltage (e.g. a "Vdd" or, alternatively, a ground voltage) of a circuit (e.g., circuit 110 in FIG. 1). Applying an "activation voltage" (e.g., a positive polarity DC voltage) at contact 146 can turn "on" transistor 134 and connect resistor 138 to contact 136 and, thereby, "activate" resistor 138 include the impedance of resistor 138 in segment 144. Alternatively, applying a different, "de-activation" voltage (e.g., a negative polarity DC voltage) at contact 146 of transistor 134 can turn "off" transistor 134, so as to disconnect resistor 138 from contact 136, and thereby "deactivate" resistor 138 to exclude the impedance of resistor 138 from segment 144.

"An impedance of a net", as used herein, can comprise any of an impedance of a device of a net, an impedance of a segment of a net, an impedance of a combination of a plurality of devices and/or segments of a net, and an impedance of the net overall. In embodiments, impedances of a net can be "characterized", such as by electrical modelling, and/or laboratory measurements, of the net under various operating states. Using such characterization, embodiments can determine preferred impedances of a net, and/or elements of a net (e.g., a preferred impedance of an impedance device and/or circuit included in a node of a net). Such preferred impedances can comprise a single, discrete (i.e., pre-determined) impedance value of a net and/or element thereof, or alternatively, can comprise a set of discrete, static impedance values, such as preferred impedances corresponding to various operating states of a net and/or element thereof.

In embodiments an impedance controller can activate and/or deactivate impedance devices of impedance circuits (e.g., such as just described with reference to resistor 138 of IMP CKT 132 in FIG. 1C) to tune impedances of segments of a net using impedances of those impedance devices. An impedance controller, in an embodiment, can activate and/or deactivate impedance devices of nodes of a net, in combination within a single node (e.g., a node having a plurality of impedance devices), and/or in combination among a plurality of nodes, to produce a particular impedance (e.g., a "characterized impedance", such as determined by prior characterization) of a net and/or a segment of a net.

To illustrate, referring again to the example of net 120 in FIG. 1B, in an embodiment, under some operating conditions of circuit 110, IMP CTL 112B can include impedances of both IMP CKT 116A and IMP CKT 116B, in respective segments 122A and 122B, to make the impedances of both of segments 122A and 122B more uniform (i.e., to tune the impedances of segments 122A and 122B). Under other operating conditions of circuit 110, IMP CTL 112B can include impedances of only one of IMP CKT 116A and IMP CKT 116B, in respective segments 122A and 122B, and exclude the impedances of the other from the respective other segment, to make the impedances of segments of net 120 more uniform. Further, in embodiments an impedance tuning system can include a plurality of impedance circuits, such as the example of IMP CKT 132 of FIG. 1C. In such an embodiment, an impedance controller can individually, or in combination, activate and/or deactivate impedance tuning devices among such a plurality of tuning circuits.

Figure 1D:
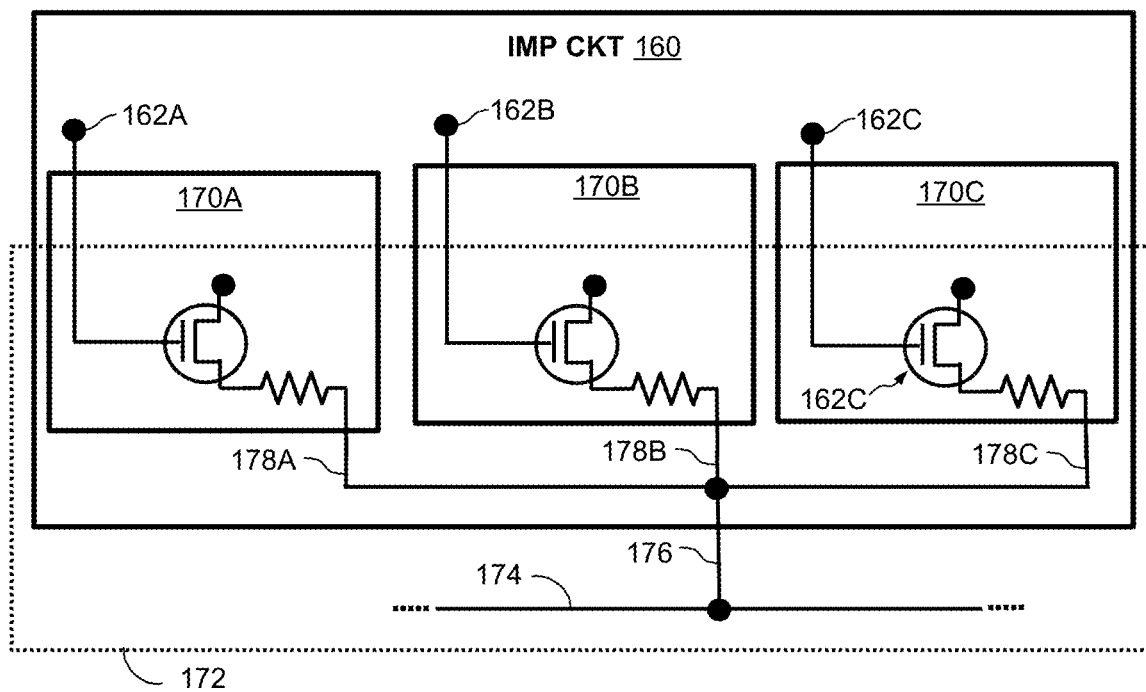
FIG. 1D illustrates an alternative example impedance circuit, according to aspects of the disclosure.

FIG. 1D depicts example net 172 comprising segments 174 and 176, and IMP CKT 160 including three impedance circuits—170A, 170B, and 170C (collectively, "impedance circuits 170")—each following the example of IMP CKT 132 of FIG. 1C. In embodiments, segment 176 can emanate from a node (not shown in FIG. 1D) that includes IMP CKT 160, and segment 174 can emanate from another node (also not shown in FIG. 1D) of net 172. Impedances circuits 170A, 170B, and 170C connect to segment 176, in FIG. 1D, by respective signal lines 178A, 178B, and 178C, and segment 176 can electrically couple impedance circuits 170 to segment 174 and net 172. In an embodiment, an impedance controller, such as the example of IMP CTL 112B in FIG. 1B, can connect to contacts 162A, 162B, and/or 162C of impedance circuits 170 to activate and/or deactivate any combination of impedance devices included in impedance circuits 170 to produce a particular impedance of segment 176 (e.g., an impedance to tune impedance of segment 176 to that of other segments of net 172.

While the example of FIG. 1D illustrates the three example impedance circuits 170 electrically coupled in parallel to segment 176, this is not intended to limit embodiments. Rather, it would be appreciated by one of ordinary skill in the art that, in embodiments, impedance circuits included in an segment of a net can number fewer or more than three, and that such the impedance circuits, and/or impedance devices of impedance circuits, can be electrically coupled in alternative circuit configurations, such as one or more of impedance circuits 170, and or impedance devices impedance circuits 170, connected in any combination of electrical series and/or parallel connections.

In embodiments, utilizing impedance devices having static (e.g., non-variable) impedances can limit impedances of segments of a net to impedances within a set, or range, of corresponding static impedances. Such a set, or range, of static impedances can, further, comprise only coarse grain impedances, corresponding to only a few such static impedances. Additionally, operating (e.g., thermal and/or voltage) states of elements of a net (e.g., operating conditions and/or states of circuit devices of nodes, and/or impedance devices of an impedance circuit) can change dynamically during operations of those elements, such that impedances of those elements, and/or of segments electrically coupling them to a net, can differ from those used in characterizing a circuit by modelling and/or laboratory measurements. As a result, in embodiments, using only static impedances devices included in impedance circuits, an impedance tuning system may not be able to closely tune impedances of one or more segments of a net to those of other segments of that net, under particular operating states of elements of a net.

Accordingly, in embodiments an impedance tuning system can include "variable impedance circuits" having a "variable impedance device" that can be capable of a continuum of impedances or, alternatively, a set of fine-grain impedances. In an embodiment, using such variable impedance circuits, an impedance tuning system can tune impedances of a segment of a net that more finely correspond to impedances of segments of a net, and/or to impedances of a segment of a net resulting from dynamic operating states of elements of a net. Such an impedance tuning system can improve signal quality of network signals transmitted on that net.

In embodiments, a variable impedance circuit can comprise any of a variety of variable impedance devices having a range of programmable and/or selectable impedances. For example, in embodiments a variable impedance device can comprise a digital potentiometer, and such an impedance device can be electronically controlled by an impedance controller. (e.g., by IMP CTL 112B in the example of FIG. 1B) to select an impedance of the potentiometer from among a range of fine-grain impedances.

In another example, in embodiments a variable impedance device can comprise a phase-change material (PCM), such as a chalcogenide material. Such phase-change materials can transition between crystalline and amorphous physical states. In embodiments, heating and, subsequently, cooling a PCM can produce persistent (i.e., enduring for a period of time) amorphous regions within a PCM, and the rate at which a PCM is cooled, subsequent to heating, can determine a number and/or geometry of amorphous and/or crystalline regions within the PCM. For example, heating a PCM and subsequently cooling it relatively slowly can produce larger or, more numerous, crystalline (or, alternatively, fewer or smaller amorphous) regions within a PCM. Alternatively, heating a PCM and subsequently cooling it relatively rapidly can produce larger or, more numerous, amorphous (or, alternatively, fewer or smaller crystalline) regions within the PCM.

A crystalline region of a PCM (i.e., a region of a PCM in a crystalline state) can be electrically conductive, and an amorphous region of a PCM (i.e., a region in an amorphous state) can be electrically non-conductive, or can be less electrically conductive than a crystalline region of the PCM. Accordingly, a PCM can have an impedance, among a continuum of impedances, corresponding to a number and/or geometry (e.g., 3-dimensional size and/or configuration) of amorphous and crystalline regions of the PCM. In an embodiment, a variable impedance device can include a PCM and an impedance of the device can vary along a continuum of impedances corresponding to a number and/or geometry of amorphous and/or crystalline regions of the PCM.

An amorphous region (or, regions) of a PCM can remain in an amorphous state for a "retention time", after which the amorphous region may transition back to a crystalline structure of the PCM. A retention time of a PCM can be determined based on, for example, properties of a particular PCM and/or a range of thermal and/or electrical conditions the PCM is subjected to during operations of a circuit that includes the PCM, such as a circuit that includes a "PCM cell" variable impedance device.

Figure 2A:
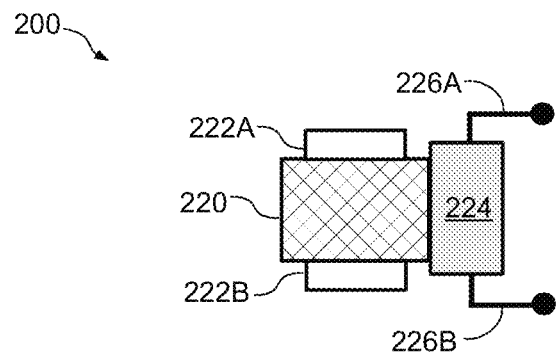
FIG. 2A illustrates an example phase-change material (PCM) cell, according to aspects of the disclosure.

In embodiments a "PCM cell" can comprise electrical contacts coupled to a PCM structure, and a thermal element, thermally coupled to the PCM, to heat and/or cool the PCM of the cell at a controlled rate. FIG. 2A illustrates a cross-sectional view of example PCM cell 200, comprising PCM 220, electrical contacts 222A and 222B (collectively, "contacts 222"), thermal element 224, and electrical contacts 226A and 226B (collectively, "contacts 226"). As previously described, PCM 220 can be, for example, a chalcogenide material and the impedance of PCM 220 can vary based on an internal structure of PCM 220 (e.g., number and/or geometry of amorphous or crystalline regions of PCM 220). However, this is only to illustrate the example of PCM cell 200 and not intended to limit embodiments. It would be appreciated by one of ordinary skill in the art that a PCM cell (e.g., PCM 220) can comprise any material having impedance properties that can vary in correspondence with varying a structure of the material.

In an embodiment, contacts 222 of PCM cell 200 can be electrically coupled to PCM 220 such that a current from an electrical circuit (not shown in FIG. 2A) coupled to contacts 222 can pass from between contacts 222 through PCM 220. The impedance of PCM cell 200 to an electrical circuit can vary based on the internal structure (e.g., crystalline versus amorphous) of PCM 220. To illustrate, FIG. 2A depicts PCM 220 in a wholly crystalline state, indicated by the cross-hatching of PCM 220. In an embodiment, a PCM in such a state can have a relative low impedance to an electrical current passing through it between contacts 222.

Figure 2B:
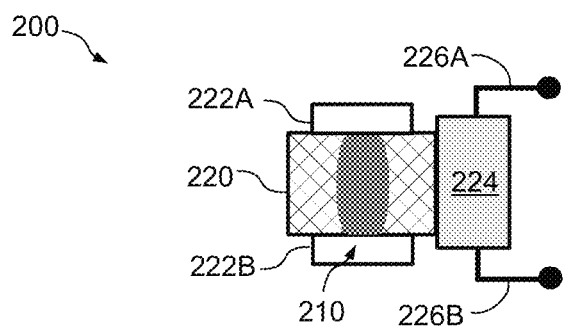
FIG. 2B illustrates an example PCM cell having an amorphous region, according to aspects of the disclosure.

In embodiments, passing an electrical current between contacts 226 and through thermal element 224 can heat thermal element 224. Subsequently cooling PCM 220 at a particular rate (e.g., by reducing a current through thermal element 224 at a particular rate) can produce a number and/or geometry of amorphous regions of PCM 220 corresponding to that rate of cooling, and the impedance of PCM cell 200 can correspond to that number and/or geometry of amorphous regions of PCM 220. To illustrate, FIG. 2B is a cross-sectional view of PCM cell 200, of FIG. 2A, depicting PCM cell 200 having an amorphous region 210, dispersed within PCM 220 between contacts 222A and 222B of PCM cell 200. In embodiments heating PCM 220 (e.g., by means of thermal element 224) and, subsequently, cooling PCM 220 at a particular cooling rate can produce region 210 within PCM 220. PCM cell 200, in FIG. 2B, can have an impedance corresponding to the geometry of region 210 within PCM 220, such as an impedance greater than that of PCM cell 200 having the structure of PCM 220 in FIG. 2A. While not shown in FIG. 2B, cooling PCM 220 at particular cooling rate can produce a plurality of amorphous regions, such as 210, and the number and geometry of these regions, within PCM 220, can produce a corresponding impedance of PCM cell 200.

Figure 2C:
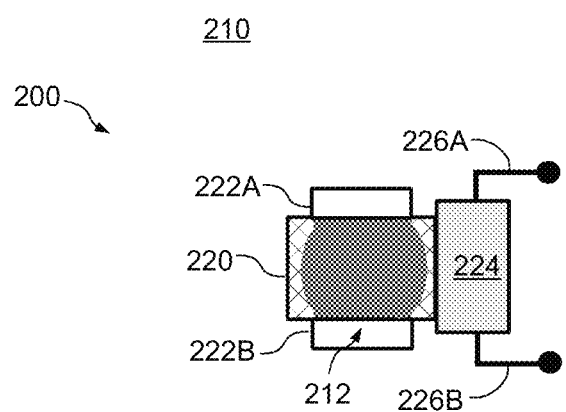
FIG. 2C illustrates an example PCM cell having an alternative amorphous region, according to aspects of the disclosure.

FIG. 2C is a cross-sectional view of PCM cell 200, of FIG. 2A, depicting amorphous region 212 of PCM 220. In FIG. 2C, region 212 is depicted as a larger than region 210 of FIG. 2B. Heating PCM 220 and, subsequently, cooling PCM 220 rapidly (e.g., at a rate more rapid than that to produce region 210 in FIG. 2B) can produce such a larger region 212 of PCM 220. In an embodiment an impedance of PCM cell 200 in FIG. 2C can be greater than that of PCM cell 200 in FIGS. 2A and 2B, corresponding to the larger geometry of amorphous region 212 in comparison to region 210 of FIG. 2B and the fully crystalline structure of PCM 220 in FIG. 2A.

The examples of FIGS. 2A-2C illustrate that, in an embodiment, impedances of a PCM cell can vary along a continuum of impedances corresponding to a number and/or geometry of amorphous regions of a PCM. In an embodiment an "impedance calibration circuit" can control a temperature of a thermal element to produce one or more amorphous regions within a PCM corresponding to a particular impedance of a PCM cell within such continuum of impedances. Such an impedance calibration circuit can thereby "program" the impedance of a PCM according to the resulting proportions and/or geometries of amorphous and crystalline regions of the PCM. For example, using again the example of FIGS. 2A-2C, in an embodiment an impedance calibration circuit (not shown in FIGS. 2A-2C) can be electrically coupled to contacts 226 of PCM cell 200 and can control an electrical current between contacts 226 and through thermal element 224 to produce (e.g., to heat and/or cool thermal element 224) a geometry of amorphous region 210, within PCM 220, corresponding to a particular impedance of PCM 220, thereby "programming" the impedance of PCM 220 and PCM cell 200.

In embodiments, an impedance tuning system can periodically re-calibrate impedance of a net (e.g., determine and/or modify an impedance of a net) according to a "calibration interval" period of time. As previously described, a PCM can have a retention time during which the PCM retains a particular amorphous region and, correspondingly, a particular impedance. In an embodiment, maintaining a particular impedance of a PCM can require that an impedance tuning system periodically re-calibrate the PCM impedance (e.g., re-program the PCM to produce or, re-produce, an amorphous region of a PCM corresponding to a particular impedance) based on such a retention time. Accordingly, in an embodiment a calibration interval can be based on, or can correspond to, a retention time of the PCM.

Figure 3:
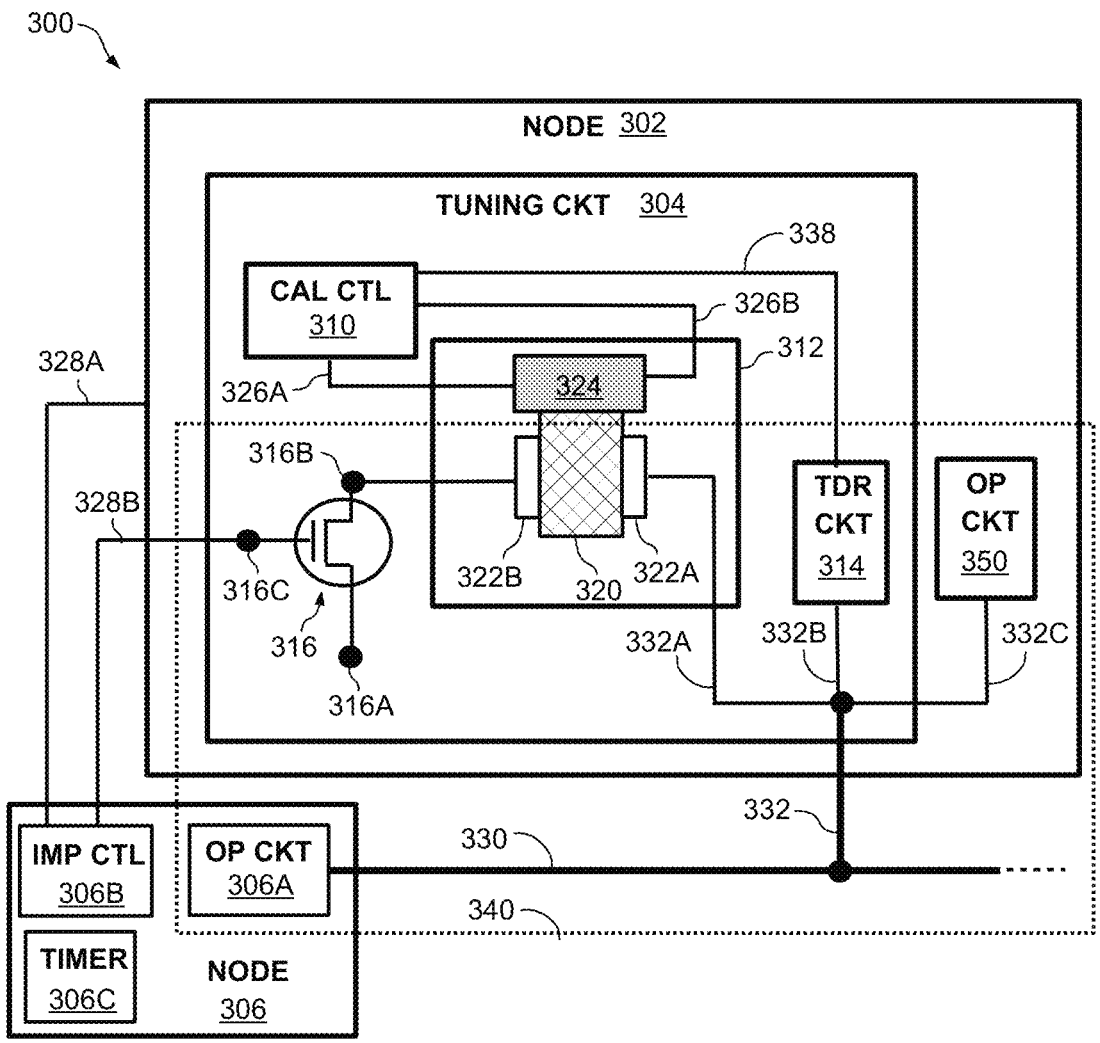
FIG. 3 illustrates an impedance tuning system in more detail, according to aspects of the disclosure.

FIG. 3 illustrates an example impedance tuning system that can calibrate an impedance of a net at particular calibration intervals. In embodiments, such an impedance tuning system can calibrate (e.g., modify) a variable impedance device to have a particular "calibration impedance" that can tune impedance of a net. Accordingly, in embodiments, calibrating an impedance of a net can comprise calibrating an impedance of a variable impedance device.

Embodiments can calibrate a variable impedance device in response to, and/or at calibration intervals corresponding to, for example, changing operating states (e.g., thermal and/or voltage states) of elements (e.g., circuit devices) of a segment of a net. For example, such an impedance tuning system can calibrate impedance of a variable impedance device at calibration intervals corresponding to a retention time of a PCM. In embodiments, at particular calibration intervals an impedance tuning system, such as the example of FIG. 3, can calibrate variable impedance devices included in a particular segment of a net to produce a continuum of or, alternatively, a set of fine-grain discrete, impedances of that segment.

In FIG. 3, example impedance tuning system 300 (hereinafter, "system 300") comprises nodes NODE 302 and NODE 306 included in net 340. In an embodiment, net 340 can be an electronic network; NODE 302 can be, for example, a node of an electronic network similar to RCV NODE 114A or 114B of FIG. 1B; and, node 306 can be, for example, a node of an electronic network similar SRC NODE 112 in FIG. 1B. However, this is only to illustrate the disclosure and is not intended to limit embodiments. It would be apparent to one of ordinary skill in the art that NODE 302 and NODE 306, in embodiments, can be any type of node included in an electronic network.

FIG. 3 further depicts NODE 306 including OP CKT 306A and IMP CTL 306B. In an embodiment OP CKT 306A can be, for example, a functional device of NODE 306 and can comprise circuit devices (not shown in FIG. 3) of NODE 306. Segment 330, of net 340, can comprise, for example, circuit devices of NODE 306 in combination with signal lines (also not shown in FIG. 3) of NODE 306, such that segment 330 can emanate from NODE 306 (e.g., segment 330 can emanate from circuit devices included in OP CKT 306A). IMP CTL 306B, in an embodiment, can be an impedance controller similar to IMP CTL 112B of FIG. 1B. In embodiments, an impedance controller can comprise, for example (but, not intended to limited embodiments) an electronic circuit, a processor, a memory, and/or a combination of such elements.

In FIG. 3, NODE 302 is shown comprising OP CKT 350 and TUNING CKT 304. In an embodiment OP CKT 350 can be, for example, a functional device of NODE 302 and can comprise circuit devices of NODE 302. Accordingly, segment 332 of net 340 can emanate from NODE 302. TUNING CKT 304, in embodiments, can be an "impedance tuning circuit", which can calibrate an impedance device, such as to match impedances of a segment of a network to that of other segments of a network. Accordingly, FIG. 3 depicts TUNING CKT 304 comprising calibration controller CAL CTL 310, PCM cell 312, transistor 316, and TDR CKT 314. PCM cell 312, in FIG. 3, is further shown comprising PCM 320 and contacts 322A and 322B. In embodiments, PCM cell 312 can be a PCM cell similar to PCM cell 200 in FIGS. 2A-2C and can have an impedance corresponding to an amorphous region of PCM 320.

In FIG. 3, NODE 302 further comprises signal lines 332A, 332B, and 332C (collectively, "signal lines 332"), which can electrically couple circuit devices of NODE 302 to segment 332. To illustrate, FIG. 3 depicts PCM cell 312 coupled to signal line 332A, TDR CKT 314 coupled to signal line 332B, and OP CKT 350 coupled to signal line 332C. In an embodiment, segment 332 of net 340 can comprise circuit devices of OP CKT 350 and TUNING CKT 304 and signal lines among signal lines 332.

Accordingly, in embodiments an impedance of segment 332 can be a combination of the impedances of circuit devices of OP CKT 350, TUNING CKT 304 (e.g., PCM cell 312, transistor 316, and/or TDR CKT 314), and signal lines among signal lines 332. Similarly, in an embodiment an impedance of segment 330 can be a combination of the impedances of circuit devices and signal lines of OP CKT 306A. While not shown in FIG. 3, NODE 306 can include an impedance tuning circuit similar to TUNING CKT 304, and circuit devices and/or signal lines of such an impedance tuning circuit can be further included in the impedance of segment 330.

To illustrate impedances of variable impedance devices that can be included in, and/or excluded from, a segment of a net FIG. 3 depicts PCM cell 312 electrically coupled by contact 322A to segment 332A of net 340, and electrically coupled to transistor 316 by contact 322B, of PCM cell 312, connected to contact 316B of transistor 316. Similar to the example of transistor 134 in FIG. 1C, in an embodiment contact 316A of transistor 316 can connect to a circuit voltage, such as a Vdd or ground voltage. An activation voltage applied to contact 316C can turn "on" transistor 316 such that PCM cell 312 is connected through transistor 316 to a voltage at contact 316A and thereby, PCM cell 312 is "activated" to include an impedance of PCM cell 312 in an impedance of segment 332. Similarly, a deactivation voltage applied to contact 316C can turn "off" transistor 316 such that PCM cell 312 is disconnected, through transistor 316, from a voltage at contact 316A and thereby, PCM cell 312 is "deactivated" to exclude an impedance of PCM cell 312 from an impedance of segment 332.

In an embodiment, an impedance controller can be coupled to a node, and/or to an impedance tuning circuit of a node, to activate and/or deactivate variable impedance devices included in an impedance tuning circuit and, thereby, include in, or exclude from, a segment of a net an impedance of those devices. Accordingly, FIG. 3 also shows IMP CTL 306B coupled to contact 316C of transistor 316 by connection 328B (which, in embodiments, can be a signal line of a PCB and/or an IC). In an embodiment, using connection 328B, IMP CTL 306B activate and/or deactivate transistor 316 to, respectively, include an impedance of PCM cell 312 in an impedance of segment 332 and/or exclude an impedance of PCM cell 312 from an impedance of segment 332.

As previously described in reference to FIG. 1D, while not shown in the example of FIG. 3, in embodiments an impedance tuning circuit, such as TUNING CKT 304, can include a plurality of variable impedance devices, such as PCM cell 312, and/or transistors, such as 316, coupling the variable impedance devices to a network segment, such as 332. In such embodiments, the variable impedance devices can be configured in any particular configuration of parallel and/or serial electrical circuits suitable to the particular application, and/or particular impedances of the variable impedance devices in a segment of a net.

While the example of FIG. 3 illustrates net 340 comprising only two nodes (NODE 306 and NODE 302), this is only to simplify the illustration of the disclosure and is not intended to limit embodiments. It would be apparent to one of ordinary skill in the art that embodiments can include, in a net, a plurality of nodes such as NODE 306 and/or NODE 302, and an impedance controller (e.g., IMP CTL 306B) can include a plurality of connections, such as 328B, to activate and/or de-activate impedance devices (such as PCM cell 312) in each of such a plurality of nodes, to establish a particular impedance of a net (and/or element thereof).

Similarly, while the example of FIG. 3 illustrates IMP CTL 306B included in node 306, this is also not intended to limit embodiments. It would be also apparent to one of ordinary skill in the art that, in an embodiment, an impedance controller can be included in any particular node of any particular net, can be distributed among nodes of a net, or can be a standalone circuit (and/or device) not included in a node of any particular net.

In embodiments an impedance tuning circuit can calibrate a variable impedance device, to establish an impedance of that device that, as included in a segment of a net, can tune an impedance of that segment to make it more uniform with respect to impedances of other segments of the net. For example, in FIG. 3 TUNING CKT 304 can calibrate PCM cell 312, such as to establish an impedance (e.g., a calibration impedance) of PCM 320 that can tune the impedance of segment 332 to make the impedance of segment 332 more uniform with respect to that of other segments of net 340 and, thereby, improve network signal quality of a net.

To illustrate in more detail, FIG. 3 illustrates connection 328A coupling IMP CTL 306B and Node 302 (and/or TUNING CKT 304 of NODE 302). Connection 328A, in an embodiment, can comprise, for example, signal lines and/or any form of communications interface suitable to communicatively couple an impedance controller of an impedance tuning system and one or more nodes of a net. In embodiments, an impedance controller can use a connection to a node, such as 328A to NODE 302, to instruct a node (or, an impedance tuning circuit of a node) to perform an impedance calibration operation, such as to calibrate a variable impedance device to have a particular calibration impedance that, when included in a segment of a net, reduce, or eliminate, reflections of network signals on signal lines of the net. For example, in an embodiment, IMP CTL 306B can communicate, using connection 328A, to NODE 302 and/or TUNING CKT 304 to calibrate PCM cell 312 to have a particular calibration impedance of PCM cell 312 that, when included in segment 332, can reduce, or eliminate, reflections of network signals on signal lines of net 340.

Continuing this example, in FIG. 3 PCM cell 312 includes element 324 coupled to CAL CTL 310 by connections 326A and 326B. In an embodiment, element 324 can be a thermal element, and can be thermally coupled to PCM 320. In such an embodiment, CAL CTL 310 can be a calibration controller that can pass an electric current through heating element 324, by means of connections 326A and 326B, to heat and/or cool element 324. For example, connections 326A and 326B can be electrical lines and, using connections 326A and 326B, CAL CTL 310 can control an amplitude and/or duration of an electrical current through element 324, to heat and/or cool element 324. In another embodiment, connections 326A and 326B can be thermal elements coupled thermally to element 324, and by heating 326A and/or 326B, CAL CTL 310 can transfer heat to element 324 and, in turn, to PCM 320. As previously described in reference to FIGS. 2A-2C, by heating and/or cooling PCM 320 (e.g. to particular temperatures and/or at particular rates, using element 324), in embodiments CAL CTL 310 can produce an amorphous region of PCM 320 corresponding to a particular, calibration impedance of PCM 320.

As also previously described in reference to FIGS. 2A-2C, in embodiments an amorphous region of a PCM can transition to a crystalline state following a particular retention interval of time, and the PCM can vary in correspondence to changing geometry of that amorphous region. Accordingly, embodiments can periodically perform a "PCM programming" operation, to program a PCM of a PCM cell, such as 320 of PCM cell 312 in FIG. 3, to produce (or, re-produce) a particular amorphous region of a PCM and, correspondingly a particular calibration impedance of a PCM. Such an embodiment can perform a PCM programming of a PCM according to a calibration interval or based on, or corresponding to, a retention interval of a PCM.

To illustrate, FIG. 3 depicts TIMER 306C included in NODE 306. In embodiments TIMER 306C can be programmed to expire upon expiration of a calibration interval time. For example, in an embodiment IMP CTL 306B (or, alternatively, another component of NODE 306, not shown in FIG. 3) can program TIMER 306C to expire after a calibration interval, such as a calibration interval based on a retention time of PCM 320 in PCM cell 312. In response to TIMER 306C expiring after the calibration interval, IMP CTL 306B can communicate (e.g., using connection 328A) to TUNING CKT 304 to determine and/or program the impedance of PCM 320.

While the example of FIG. 3 depicts TIMER 306C as included in NODE 306, this is only to illustrate the disclosure and is not intended to limit embodiments. It would be apparent to one of ordinary skill in the art that in embodiments an impedance tuning system can include an interval time, such as TIMER 306C, in other components of the system, such as NODE 302 or components thereof, or as a standalone component of the system.

It would be further apparent to one of ordinary skill in the art that an embodiment can include a plurality of interval timers in an impedance tuning system. For example, each of a plurality of a nodes in a net can include PCM cells having PCMs that have retention times differing from PCMs of other nodes. Accordingly, in an embodiment each node can include an interval timer programmed with a calibration interval corresponding to a PCM cell included in that node. Similarly, in embodiments an impedance tuning system can include a plurality of interval timers, each timer programmed with a calibration interval corresponding to a retention time of a set of PCM cells (which can be in the same, and/or different nodes) having the same PCM retention time, and the impedance tuning system can include the timers in various nodes and/or other components of the system.

The example of FIG. 3 illustrates an example impedance tuning system utilizing a variable impedance device comprising a PCM cell; however, this is not intended to limit embodiments. Rather, it will be appreciated by one of ordinary skill in the art that, in embodiments, a variable impedance device included in an impedance tuning system, such as the example of FIG. 3, can include fixed (i.e., non-variable) impedance devices, and/or can include alternative variable impedance circuits, and or variable impedance devices, such as a digital potentiometer, in addition to, or in place of, a PCM cell.

It will be further appreciated by one of ordinary skill in the art that, in embodiments, such impedance devices can be configured in an impedance tuning circuit in a manner similar to that of PCM cell 312 in TUNING CKT 304 of FIG. 3 and that a calibration controller can calibrate impedances of such alternative impedance devices. For example, with reference to FIG. 3, in an embodiment TUNING CKT 304 can include a digital potentiometer (not shown in FIG. 3) as a variable impedance device, in addition to, or in lieu of, PCM cell 312 and CAL CTL 310 can be connected to an interface of the potentiometer to enable CAL CTL 310 to select an impedance of the potentiometer.

While FIG. 3 illustrates a single instance of a variable impedance device (i.e., PCM cell 312) included in TUNING CKT 304, this is also not intended to limit embodiments. As previously described in reference to FIG. 1D, in embodiments an impedance tuning circuit can comprise a plurality of impedances devices, such as PCM cell 312. Accordingly, it would be appreciated by one of ordinary skill in the art that, in embodiments, an impedance tuning system can comprise a plurality of variable impedance devices (e.g., PCM cells) and that impedance calibration operations can include calibrating (e.g., programming a PCM) impedances of one, some, or all of a plurality of the variable impedance devices. Additionally, it would be appreciated by one of ordinary skill in the art that, in embodiments, a tuning circuit, such as 304, can include such variable impedance devices connected electrically in parallel, series, or a combination thereof.

As previously described, in embodiments elements of a net (e.g., circuits and/or circuit devices of a net) can experience changes in operating states over time, such as variations, or "drift", in operating temperature and/or voltage from nominal operating values. Such drift in elements of a net can occur over time at particular "drift rates" (e.g., a thermal drift rate, and/or a voltage drift rate). In embodiments a "drift rate" can be, for example, a rate at which variations in temperature, voltage, current, and/or other operational parameters of elements of a circuit are expected to occur over operating times of a circuit or net. Such a "nominal" drift rate can be pre-determined based on, for example, characterization of a circuit, and/or elements thereof.

Changes in operating states of an element of a net (e.g., changes in thermal and/or voltage states of a device or circuit of a net), such as can be associated with a drift rate, can produce corresponding variations in impedances of a net. To account for such variations, embodiments can periodically perform an impedance calibration operation (e.g., determine an impedance, and/or program, a PCM of a PCM cell) to "re-calibrate" an impedance device of a net, or a segment of a net to account for such changing impedances. Accordingly, in embodiments a calibration interval can correspond to (in addition to, or in place of, a PCM retention time) a drift rate.

However, a drift rate can, under certain operating conditions, itself vary (e.g., increase or decrease) from nominal drift rates (e.g., drift rates determined by device, circuit, and/or network characterization). Accordingly, in embodiments an impedance tuning system can monitor (e.g., measure), over time, operating states (e.g., thermal, voltage, and/or current states) of a net and/or elements thereof. By monitoring these, embodiments can determine changes in drift rates from nominal drift rates and, in response, can dynamically compute a calibration interval that can account for changes in such drift rates.

For example, referring again to example impedance tuning systemb300 of FIG. 3, in an embodiment, IMP CTL 306B, in FIG. 3, can include a circuit and/or processor (not shown in FIG. 3) that can monitor, over time, operating states of elements of net 340, such as operating states of functional and/or circuit devices included in NODE 306 and/or NODE 302 (and/or other nodes and/or circuits of net 340, not shown explicitly in FIG. 3, but that, in embodiments, can be included in net 340). Based on such monitoring, IMP CTL 306B (and/or the monitor circuit) can dynamically determine associated drift rates and can, correspondingly, modify (e.g., increase or decrease) a calibration interval. For example, in an embodiment, IMP CTL 306B can modify a calibration interval, previously based on a nominal drift rate, to have a time period corresponding to a dynamically changing drift rate determined by monitoring the operating states of elements of net 340.

In an embodiment impedance calibration operations of an impedance tuning system, such as 300 of FIG. 3, can include dynamically determining whether or not an impedance of a net (and/or an element of a net, such as an impedance tuning circuit) is within a tuning range of impedances. In embodiments a "tuning range" can comprise a range of impedances of, for example, a segment of a net, a circuit of a net, an impedance device (e.g., a variable impedance device) included in a net, and/or a net overall. Such a tuning range, in embodiments, can comprise a range of impedances of a net that can maintain or, alternatively, improve quality of a network signal transmitted on a net. For example, in an embodiment a tuning range can comprise a range of impedances of a net that can reduce, or eliminate, network signal distortions, such as network signal reflections, on a net.

Embodiments can employ an "impedance analysis" of a net to determine if the net, a segment of the net, and/or a variable impedance device included in the net, has an impedance within (or, alternatively, outside of) a tuning range of impedances of a net. As used herein, "impedance analysis" refers to an analysis of a net (and/or elements thereof), performed by an impedance tuning system, that can determine that an impedance of a net (and/or element thereof) is within (or, outside of) a tuning range. For example, in an embodiment an impedance tuning system can perform an impedance analysis to determine if an impedance of a net is within or, conversely, outside of a tuning range as a result of a voltage and/or temperature drift of a circuit, and/or device, included in a net. In another example, an impedance tuning system, in an embodiment, can perform an impedance analysis to determine if an impedance of a variable impedance device has changed (e.g., as a result of changes in an amorphous region of a PCM) over time, such that an impedance of the net is outside of a tuning range or, conversely, that an impedance of a variable impedance device has not changed sufficiently to produce an impedance of the net outside of a tuning range.

In embodiments an impedance analysis can comprise analyzing a network signal transmitted on a net. Such an impedance analysis can comprise, for example, a time-domain reflectometry (TDR) analysis of an impedance of a net and/or element of a net. In embodiments, an impedance tuning system can perform a TDR analysis using a TDR circuit (e.g., a TDR circuit included in an impedance tuning circuit of an impedance tuning system) to transmit an "incident" signal on a segment of a net (e.g., on a signal line included in the segment), The TDR circuit can subsequently monitor that segment of the net (e.g., monitor the same or an alternative signal line included in the segment) for an "incident signal reflection" (i.e., a network signal reflection of the incident signal) received from the net.

Based on a TDR circuit detecting an absence of an incident signal reflection, in an embodiment an impedance tuning system (e.g., an impedance tuning circuit in a node of a net) can determine that an impedance of the net is within a tuning range of impedances. Alternatively, by analyzing an incident signal reflection (e.g., by determining electrical characteristics, such as phase and/or amplitude of the incident signal reflection) detected by a TDR circuit, embodiments can determine that an impedance of a net is within or, conversely, outside of a tuning range of impedances and, possibly, in the converse case, by how much an impedance of the net is outside of the tuning range. In response, such an impedance tuning circuit can, for example, calibrate a variable impedance device (e.g., by re-programming a PCM of the PCM cell) included in the net, and can repeat the TDR analysis, to tune the impedance of the net to be within a tuning range. In embodiments, a TDR analysis can improve precision and/or accuracy of an impedance analysis of a net (and/or elements thereof) and, correspondingly, can improve calibrations of variable impedance devices included in a net.

To illustrate, in FIG. 3 TUNING CKT 304 includes TDR CKT 314. In embodiments, TDR CKT 314 can be, for example, a circuit capable of performing TDR operations and/or a TDR analysis. FIG. 3 further depicts CAL CTL 310 connected to TDR CKT 314 by interface 338 and, in embodiments, using interface 338 CAL CTL 310 can periodically (e.g., according to a calibration interval) instruct, or stimulate, TDR CKT 314 to perform a TDR analysis of segment 332. In response, TDR CKT 314 can transmit an incident signal on signal line 332B, which can propagate the incident signal over segment 332 onto net 340. TDR CKT 314 can subsequently monitor signal line 332B to detect an incident signal reflection received from net 340 over segment 332. TDR CKT 314 can analyze the incident signal reflection (or, absence thereof) and can communicate the results of the analysis to CAL CTL 310. CAL CTL 310 can determine, based on the results of the analysis received from TDR CKT 314, whether or not to calibrate PCM cell 312 (e.g., produce a calibration impedance of PCM 320, and/or segment 332, within a tuning range). CAL CTL 310 can then calibrate PCM cell 312 (e.g., program PCM 320) accordingly.

Figure 4:
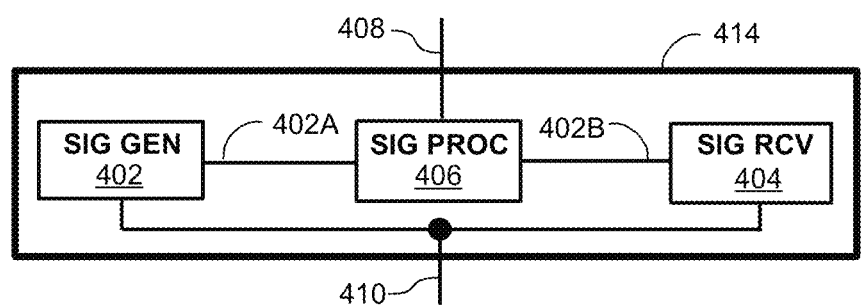
FIG. 4 illustrates a time-domain reflectometer (TDR) circuit, according to aspects of the disclosure.

To illustrate, in more detail, a TDR circuit such as TDR CKT 314 in FIG. 3, FIG. 4 illustrates example TDR CKT 414. FIG. 4 depicts TDR CKT 414 comprising signal generator SIG GEN 402, signal receiver SIG RCV 404, signal processor SIG PROC 406, interface 408 and interface 410. FIG. 4 further depicts SIG PROC 406 coupled to SIG GEN 402 by means of interface 402A and coupled to SIG RCV 404 by means of interface 402B.

In embodiments, TDR CKT 314 (of FIG. 3) can comprise components, and/or configurations of components, such as illustrated by the example of TDR CKT 414. Using the example of TDR CKT 414, in FIG. 4, as an embodiment of TDR CKT 314, in FIG. 3, to perform a TDR analysis interface 408 can connect TDR CKT 414 to interface 338 of CAL CTL 310, in FIG. 3, and interface 410 can connect TDR CKT 414 (e.g., SIG GEN 402 and SIG RCV 404) to signal line 332B, of segment 332 of net 340 in FIG. 3. Accordingly, in embodiments a TDR circuit such as TDR CKT 414 can perform (or, to assist system 300, in FIG. 3, in performing) a TDR analysis.

For example, SIG PROC 406 can receive from CAL CTL 310, by means of interface 408 coupled to interface 338, an instruction to perform a TDR analysis of, for example, segment 332. By means of interface 402A, SIG PROC 406 can instruct SIG GEN 402 to transmit an incident signal on interface 410, which can propagate then on signal line 332B to segment 332 and net 340. By means of interface 402B, SIG PROC 406 can further instruct SIG RCV 404 to monitor signal line 332B for an incident signal reflection received from net 340 on segment 332.

Upon detecting an incident signal reflection (or, absence thereof) on signal line 332B (and/or other signal lines comprising segment 332), SIG RCV 404 can communicate (e.g., by means of interface 402B) the characteristics of the incident signal reflection and SIG PROC 406 can analyze those characteristics and communicate the results of the analysis (e.g., by means of interface 408 of TDR CKT 414 connected to interface 338) to CAL CTL 310. Alternatively, or additionally, SIG PROC 406 can communicate characteristics of the incident signal reflection and CAL CTL 310 (and/or, another component of system 300) can perform a TDR analysis of impedances of segment 332B. Based on the TDR analysis, CAL CTL 310 (and/or, another component of system 300) can determine whether or not to calibrate PCM cell 312 (e.g., to program PCM 320, of FIG. 3 to have a particular calibration impedance.

In embodiments, physically locating a TDR circuit close to impedance device(s) of an impedance tuning circuit, and/or signal lines emanating from an impedance tuning circuit, can improve the results of a TDR analysis of a segment of a net. For example, locating a TDR circuit on a signal line, or closely located to a signal line, connecting an impedance device (e.g., a PCM cell) of a segment of a net can improve the ability of a TDR circuit to detect and/or measure an incident signal reflection on that segment of a net, and/or determine a corresponding impedance of that segment of a net. Accordingly, FIG. 3 illustrates TDR CKT 314 located within TUNING CKT 304, and associated particularly with circuit devices and signal lines of segment 332. However, this is not intended to limit embodiments and it would be apparent to one of ordinary skill in the art that various TDR circuit designs, and locations of such circuits within an impedance tuning system or circuit, can enable a TDR circuit to detect and/or measure an incident signal reflection on a net, and/or a segment of a net, according to other aspects of the net.

In embodiments, based on results of a TDR analysis, an impedance tuning system can determine that an impedance of a net is not within a tuning range and can, accordingly, determine a calibration impedance to apply to a variable impedance device of the net. For example, based on results of a TDR analysis, an impedance tuning system can compute a calibration impedance, or a variable impedance device, that can reduce or eliminate an incident signal reflection analyzed in a TDR analysis.

Alternatively, or additionally, an impedance tuning system can include a set of impedance values corresponding to particular results of a TDR analysis. Based on a TDR analysis, such an impedance tuning system can select, from that set of impedance values, a calibration impedance. For example, in FIG. 3, in an embodiment IMP CTL 306B and/or TUNING CKT 304 can include (e.g., in a memory) a set of impedance values corresponding to particular results of a TDR analysis performed using TDR CKT 314. Based on a result of such a TDR analysis, TUNING CKT 304 can compute, or can select, from that set, a calibration impedance of PCM and can program PCM 320 to have that calibration impedance. Subsequent to calibrating that variable impedance device, an embodiment can repeat an impedance analysis.

While the example of FIG. 3 includes using a TDR circuit (TDR CKT 314) to perform an impedance analysis, this is only to illustrate the disclosure and not intended to limit embodiments. It would be apparent to one of ordinary skill in the art that in embodiments an impedance tuning system, or an impedance tuning circuit of an impedance tuning system, can determine an impedance of a net (and/or elements thereof) by alternative impedance analysis means, such as using electrical circuits, in addition or alternative to a TDR circuit, electrically coupled to circuit, impedance devices, and/or segments of a net, to measure and/or compare (e.g., to nominal or dynamically changed) impedances of the circuits, devices, and or the segment of the net.

In embodiments, to analyze an impedance of a net, and/or calibrate an impedance device of a net (e.g., to perform an impedance analysis and/or program a PCM) an impedance tuning system can suspend operational transmissions (e.g., transmissions associated with operations of functional and/or circuit devices of the nodes) on a net, perform impedance calibration operations, and then resume operational transmissions on the net. For example, with reference again to FIG. 3, to calibrate impedance devices associated with segment 330 and/or 332 of net 340, IMP CTL 306B can instruct NODE 306 and NODE 302 (and/or, additional nodes, not shown in FIG. 3, but that can be included in net 340) to suspend operational transmissions on net 340. For example, IMP CTL 306 can have an interface to functional and/or circuit devices of node 306 (not shown in FIG. 3) and can, by such an interface, instruct node 306 to suspend and/or resume operational transmissions of NODE 306. Similarly, using connection 328A, for example, IMP CTL 306B can instruct NODE 302 to suspend and/or resume operational transmissions on net 340.

Having suspended such operational transmissions on net 340, using TUNING CKT 304 and/or TDR CKT 314, for example, system 300 can perform a TDR analysis and, based on the analysis, can determine whether or not segment 332 and/or PCM cell 312 is within a tuning range. If not, system 300 can compute, and/or select from a set of impedances, a calibration impedance to program into PCM 320 of PCM cell 312, which can be also based on results of that TDR analysis. Using TUNING CKT 304, for example, system 300 can then perform a PCM programming operation to calibrate PCM cell 312 (e.g., program PCM 320) to have that calibration impedance. Subsequent to calibrating PCM 312, system 300 can repeat the TDR analysis to determine if the calibration impedance of PCM cell 312 reduces or eliminates an incident signal reflection on net 340.

If, based on the subsequent TDR analysis, the calibration impedance of PCM cell 312 (e.g., of PCM 320) does not improve the incident signal reflection, system 300 can continue calibration by repeating calibration of PCM cell 312 using a different calibration impedance. If the calibration impedance of PCM cell 312 (e.g., of PCM 320) improves the incident signal reflection or, if nodes of net 340 must resume operational transmissions, system 300 can discontinue calibration of impedance devices of net 340 and can instruct nodes of net to resume operational transmissions.

In embodiments a net can include a plurality of segments emanating from nodes of the net. Accordingly, in an embodiment an impedance tuning system can suspend operational transmissions on a net, perform impedance calibration operations (e.g., TDR analysis and PCM programming) of one or more of the segments, and then resume operational transmissions using the impedances of the segments determined and, as necessary to improve network signals on a net, modified as part of impedance calibration operations.

Impedance tuning operations of the examples of FIG. 3 and FIG. 4 are described herein with reference to "circuits" performing the operations, and in embodiments such circuits can comprise a variety of electronic devices, such as transistors, resistors, capacitors, inductors, and/or various logic devices. However, such example circuits do not limit embodiments. Rather, in embodiments "circuits" and/or components of an impedance tuning system (e.g., impedance controllers, calibration controllers, and/or impedance tuning circuits) can comprise processors, such as programmable and/or special purpose processors, and such processors can perform, for example, impedance calibration operations of the disclosure, such as determining a calibration interval, monitoring drift rates, performing an impedance analysis, and/or calibrating impedance devices.

Similarly, with reference to FIG. 4, in an embodiment TDR CKT 414, SIG PROC 406, SIG GEN 402, and/or SIG RCV 404 can comprise a processor, and one or more such processors can, for example, determine characteristics of an incident signal to transmit on a net, transmit an incident signal on a net, detect and/or analyze an incident signal reflection on a net, determine characteristics of an incident signal reflection, and/or determine impedances of a segment of a net corresponding to an incident signal reflection.

As illustrated by the foregoing examples of FIGS. 1A-1D, 2A-2C, 3, and 4, in embodiments an electronic network can comprise circuits and segments of an electronic network, emanating from such circuits, coupling the circuits within the network. Such embodiments can implement a method of tuning impedances of a segment of a net, utilizing circuits, structures, and operations similar to those described with reference to these foregoing examples.

Figure 5:
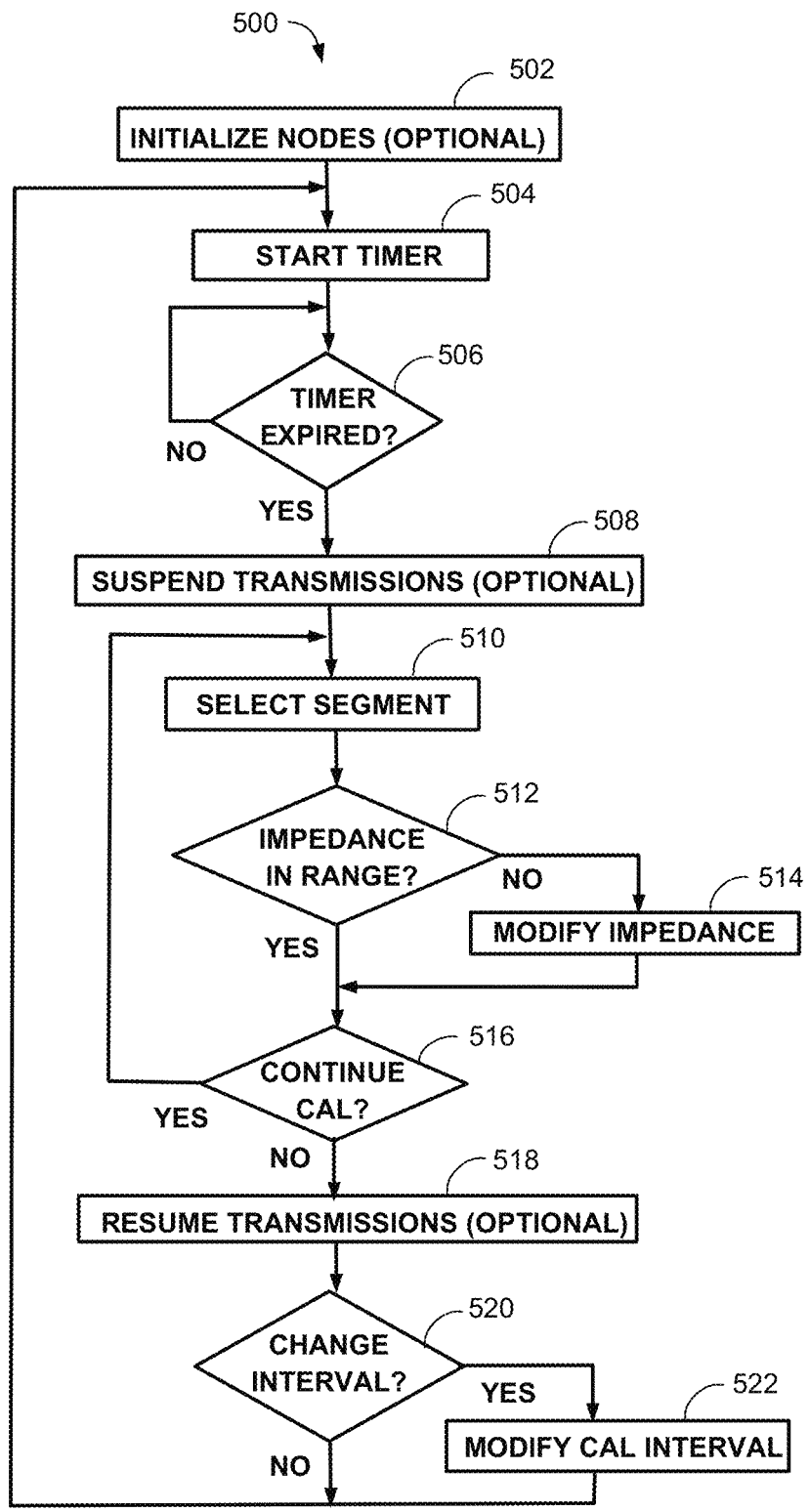
FIG. 5 is a flowchart that illustrates an example method to tune impedance of an electronic network, according to aspects of the disclosure.

FIG. 5 illustrates example method 500, which can perform impedance calibration operations of a segment of a net, according to aspects of the disclosure such as illustrated by the examples of FIGS. FIGS. 1A-1D, 2A-2C, 3, and 4. In embodiments an impedance tuning system, such as the example of FIG. 3, for example, can perform a method, such as method 500 in FIG. 5, to tune (e.g., calibrate) impedances of one or more segments of a net emanating from respective nodes of the net.

For purposes only of illustrating the disclosure, but not intended to limit embodiments, example method 500 is described as performed by an impedance tuning system, referred to as simply "the system" for brevity in the description of method 500. In embodiments, the system can be similar to example system 300 of FIG. 3. However, it would be apparent to one of ordinary skill in the art that an embodiment can implement an impedance tuning method, such as 500, in a variety of alternative circuits and/or configurations of circuits, different from the example of FIG. 3, and/or components of an impedance tuning system different from components of an impedance tuning system such as the example of FIG. 3.

Additionally, and also for purposes only of illustrating the disclosure, but not intended to limit embodiments, in the description of example method 500 an "impedance device" can be considered to be a variable impedance device, such as an impedance device, or circuit, comprising a PCM cell. However, one of ordinary skill in the art would appreciate that, in embodiments, an "impedance device" of method 500 can comprise any form of variable impedance device, such as previously described, and can further include fixed impedance devices in combination with one or more variable impedance devices.

In FIG. 5, at operation 502 of method 500 the system (optionally) initializes impedances of impedance devices included in one or more segments of a net. For example, in an embodiment an impedance device of a segment can comprise a PCM cell and, at 502, the system can program the PCM of the PCM cell to have an "initialization impedance", such as a nominal impedance determined by characterization of the nodes and/or net, and/or which can correspond to initial operating states of nodes of a net. As previously described, in embodiments the system can include a memory that can record such initialization impedances and, at 502, the system can reference the memory to initializes the impedances of particular segments of the net.

At 504, the system programs an interval timer to expire following a particular interval of time. In embodiments, at 504 the system can program the interval timer to expire after a calibration interval, and the calibration interval can correspond, for example, to a retention time of a PCM included in a segment of the net, a drift rate of operating states of elements of a net, and/or a combination of these. As previously described with reference to FIG. 3, in embodiments the system can comprise a plurality of interval timers and, at 504, the system can program a plurality of such timers, and the timers can have the same and/or differing time intervals. Accordingly, in the description of operations 506-518 of method 500 to follow, it is understood that "timer" refers to any particular timer, among a possible plurality of timers, and that "segment" of a net refers to any one segment, and/or set of segments, of a net associated with a particular timer among a plurality of interval timers.

At 506, if the interval timer has not expired, the system continues to await (at 506) expiration of the timer. If, alternatively, at 506 the interval timer has expired, at 508 the system (optionally) suspends operational transmissions on the net, such as to prepare for performing impedance calibration operations on the segment(s) of a net associated with the timer. An embodiment can suspend operational transmissions on a net, for example, to perform impedance analysis of a segment of a net, and/or to calibrate an impedance of an impedance device included in a segment of a net.

At 510 the system selects a "calibration segment" of the net associated with the timer programmed at 504, to calibrate an impedance (e.g., analyze and/or modify an impedance) of an impedance device of that segment. In embodiments, a calibration segment can be a segment of a net that includes one or more variable impedance devices (e.g., a PCM cell and/or a digital potentiometer).

At 512, the system determines if an impedance of the net is within a tuning range of impedances. Accordingly, in embodiments, determining if an impedance of a net is within a tuning range can comprise determining if an impedance of the calibration segment, and/or an impedance device of the calibration segment, is within a tuning range of impedances. As previously described, in an embodiment, to determine, at 512, if an impedance of the net is within a tuning range, the system can measure impedances of the net (e.g., impedances of segments of the net, devices of the net, and/or the net overall), and/or can perform an impedance analysis of the net. For example, in an embodiment, at 512 the system can perform a TDR analysis, such as described in reference to the example TDR CKT 314 of FIG. 3, to determine if an impedance of the net is within a tuning range. As previously described in reference to FIG. 3, such a TDR analysis can comprise transmitting an incident signal on a net, monitoring the net for an incident signal reflection and, based on the absence of, or alternatively, characteristics of, an incident signal reflection, determine if an impedance of the net is within a tuning range.

If, at 512, the system determines that an impedance of the net is within a tuning range, the system performs operation 516. Alternatively, if the system determines, at 512, that an impedance of the net is not within the tuning range, at 514 the system calibrates an impedance device, included in the calibration segment, to have a particular calibration impedance (e.g., an impedance that can produce an impedance of the net, or an element thereof, within a tuning range, and/or reduce or eliminate a signal reflection on a net). At 514, an embodiment the system can compute or select (e.g., from a set of impedances in a memory) a calibration impedance, and can calibrate the impedance device to have that calibration impedance.

In embodiments, an impedance tuning system can compute or select a calibration impedance based on, for example, results of an impedance analysis and/or based on dynamic operational states of an impedance device and/or other element of the segment. To calibrate the impedance device, in an embodiment the system can, for example, program a PCM cell (and/or a potentiometer), included in the calibration segment, to have that calibration impedance. Using the example of FIG. 3, in an embodiment, the system can employ a calibration controller to program the impedance of a PCM cell, and/or tune impedance of a potentiometer, included in the calibration segment, to have the calibration impedance.

At 516 the system determines whether or not to continue calibrating impedances of the net. In embodiments, the system can determine to continue calibrating impedances, for example, to: determine if an impedance of an impedance device, modified at 514, achieves an impedance that improves network signal quality on the net; to calibrate impedances of additional segments; and/or, to calibrate impedances of the same or other impedance devices included in the calibration segment. In embodiments, at 516 the system can determine to continue calibration of an impedance device (e.g., repeat 512-516 to re-calibrate an impedance of an impedance device) using a different, or alternative calibration impedance, such as to refine an impedance of the net (and/or a segment of the net, such as the calibration segment) within a narrow range of a broader tuning range.

Additionally, or alternatively, in embodiments the system can determine whether or not to continue impedance tuning based on a time interval such as a "suspension interval". In an embodiment, a suspension interval can be, for example, a period of time during which operational transmissions can be suspended among nodes of a net without disrupting normal operations of the nodes. Accordingly, in an embodiment the system can include a suspension interval timer that can be programmed (e.g., in conjunction with operation 508) to expire after a suspension interval time. At 516, in an embodiment, the system can determine to continue calibration operations based on a suspension interval timer not having expired or, alternatively, to discontinue calibration operations based on a suspension interval timer having expired.

If the system determines, at 516, to continue calibration operations, the system repeats 510-516. At 510 the system again selects a calibration segment and, using this segment, performs 512-516. For example, if a net includes a plurality of segments, at 510 the system can select, as a calibration segment, a segment from among segments of the net not previously selected at 510, with which to repeat operations 512-516.

Alternatively, or additionally, if the system determines, at 516, to continue calibration operations, in embodiments, at 510 the system can select, as a calibration segment, a segment previously selected at 510. For example, in the case that the system has, at 514 modified an impedance of a calibration segment previously selected at 510, at 510 the system can select that previously selected calibration segment with which to repeat operations 512-516. In another example, if the calibration segment selected at 510 includes a plurality of impedance devices, at 510 the system can select that same calibration segment and perform operations 512-516 with respect to one or more additional impedance devices of that calibration segment.

If the system determines, at 516, to not continue calibration operations, at 518 the system (optionally) resumes operational transmissions suspended in operation 508. For example, at 518 the system can resume operational transmission based on having, at 508, suspended operational transmissions on the net.

At 520, the system determines whether or not to modify a calibration interval, such as a calibration interval programmed in an interval timer in operation 506 and/or a suspension interval associated with 508 and 516. In an embodiment, at 520 the system can determine to change a calibration interval based on, for example, results of monitoring operating states of a circuit (and/or components of a circuit) included in the net and determining that a drift rate has changed relative to, for example, a nominal drift. In an embodiment, at 520 the system can determine to change a calibration interval associated with a particular segment, one or more calibration intervals associated with a plurality of segments, and/or one or more calibration intervals associated with one or more impedances devices of segments of the net.

If the system determines, at 520, to change one or more timer intervals (e.g., a calibration and/or suspension interval), at 522 the system modifies the respective intervals and repeats 504-522 using the modified intervals. If, alternatively, at 520 the system determines to not change the intervals, the system repeats 504-522 using the unmodified intervals.

Figure 6:
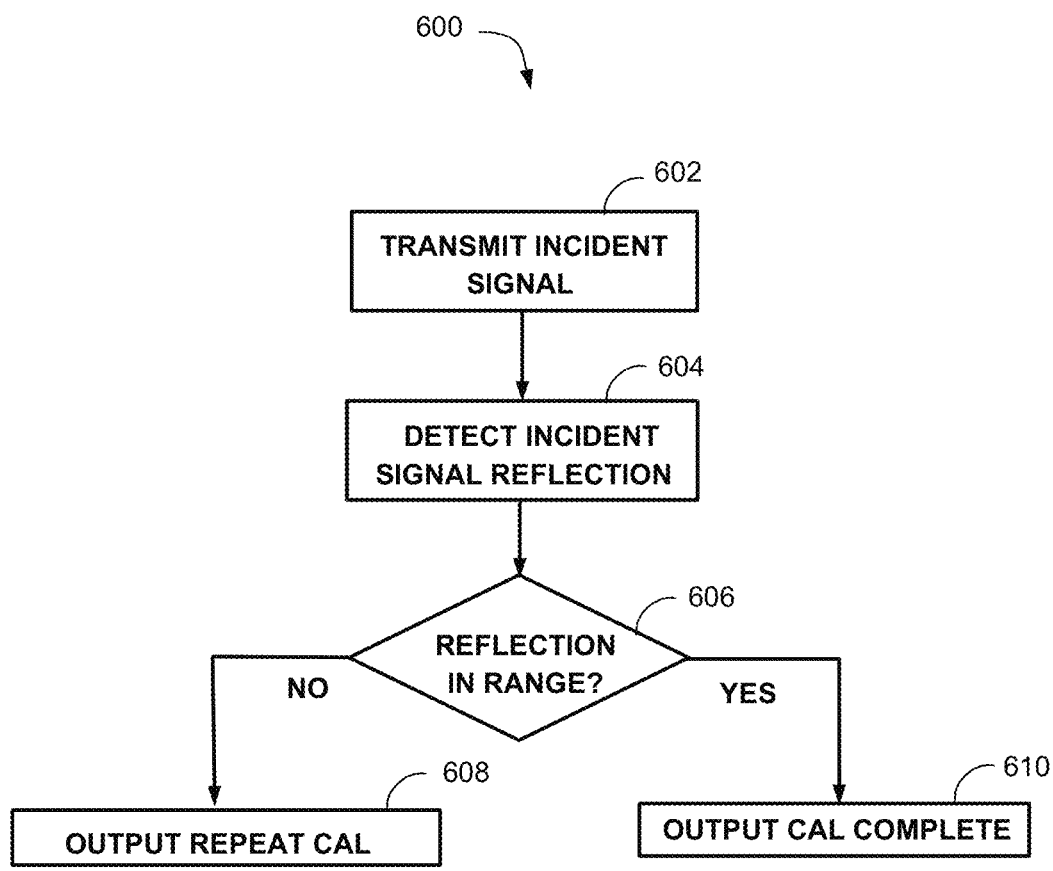
FIG. 6 is a flowchart that illustrates an example method to determine impedance using a TDR operations, according to aspects of the disclosure.

As previously described, embodiments can utilize an impedance analysis to determine if an impedance of a net (and/or, elements thereof) is within a tuning range. FIG. 6 illustrates example method 600 that embodiments can employ to perform such an impedance analysis using a TDR analysis of a net, and/or elements (e.g., segments and/or devices) of a net. An embodiment can perform example method 600, for example, in conjunction with operation 512 of example method 500. In another example, in an embodiment an impedance tuning system, such as 300 in FIG. 3 (e.g., TUNING CKT 304 and/or TDR CKT 314 of FIG. 3), can perform a method similar to example method 600 to perform a TDR analysis of a net, and/or a segment of a net.

For purposes of illustrating the disclosure, example method 600 is described as performed by a TDR circuit (referred to in the description of method 600 as "the TDR circuit") of an impedance tuning circuit. In embodiments the TDR circuit can comprise a TDR circuit similar to TDR CKT 414 of FIG. 4, and can include components of TDR CKT 414 such as illustrated in FIG. 4. However, this for purposes only of illustrating the disclosure and is not intended to limit embodiments. It would be apparent to one of ordinary skill in the art that, in embodiments, any variety of components, and/or configurations of components and/or circuits, of an impedance tuning system, an impedance tuning circuit, and/or a TDR circuit can perform operations of example method 600, and/or alternative TDR analysis methods, within the scope of the disclosure.

As illustrated in FIG. 6, at 602 the TDR circuit (e.g., a signal generator of the TDR circuit, such as SIG GEN 402 in FIG. 4) transmits an incident signal on a segment of a net (e.g., on a signal line of a calibration segment, such as described in reference to FIG. 4). At 604, the TDR circuit (e.g., a signal receiver of the TDR circuit, such as SIG RCV 404 in FIG. 4) detects, on the calibration segment, an incident signal reflection (e.g., a reflection received from the net on the calibration segment) or, alternatively, the absence of an incident signal reflection.

At 606, the TDR circuit (e.g., a signal processor of the TDR circuit, such as SIG PROC 406 in FIG. 4) analyzes the incident signal reflection detected at 604 to determine if characteristics of the signal reflection (e.g., a signal amplitude, phase, or combination thereof) indicate an impedance of the net is within a preferred range of impedances, such as a tuning range previously described. For example, based on detecting, at 604, the absence of an incident signal reflection, at 606 the TDR circuit can determine that an impedance of the net is within the preferred range. In another example, based on characteristics of an incident signal reflection detected at 604, at 606 the TDR circuit can determine that an impedance of the net is within the preferred range or, alternatively, that an impedance of the net is not within the preferred range.

If, at 606, the TDR circuit determines that the impedance of the net is not within the preferred range (e.g., a tuning range) of impedances, at 608 the TDR circuit can output that impedance calibration of the net (e.g., programming the impedance of one or more PCM cells included in the net) should be repeated, and/or can output that the TDR analysis determined that the impedance of the net is not within the preferred range. In an embodiment, the output at 608 can be utilized, for example, in operation 512, of method 500 in FIG. 5, to determine to continue calibration of a calibration segment of the net (and/or impedance devices included in a calibration segment, such as one or more PCM cells).

Alternatively, if the TDR circuit determines, at 606, that the impedance of the net is within the preferred range of impedance values, at 610 the TDR circuit can output that impedance calibration of the net (and/or a segment of the net) is complete, and/or can output that the TDR analysis determined that the impedance of the net is within the preferred range. In an embodiment, the output at 610 can be utilized, for example, in operation 512, of method 500 in FIG. 5, to determine to not continue calibration of a calibration segment and/or impedance devices included in a calibration segment.

In embodiments an impedance tuning system, and/or components thereof (e.g., components of an impedance control and/or impedance tuning circuit, components of a TDR circuit, and/or components of a calibration controller) can include one or more processors, and/or a computing system including one or more processors. Accordingly, FIG. 7 illustrates example computing system 700 that can be, or can be included in, an impedance tuning system and/or can perform functions and/or operations of the disclosure.

Figure 7:
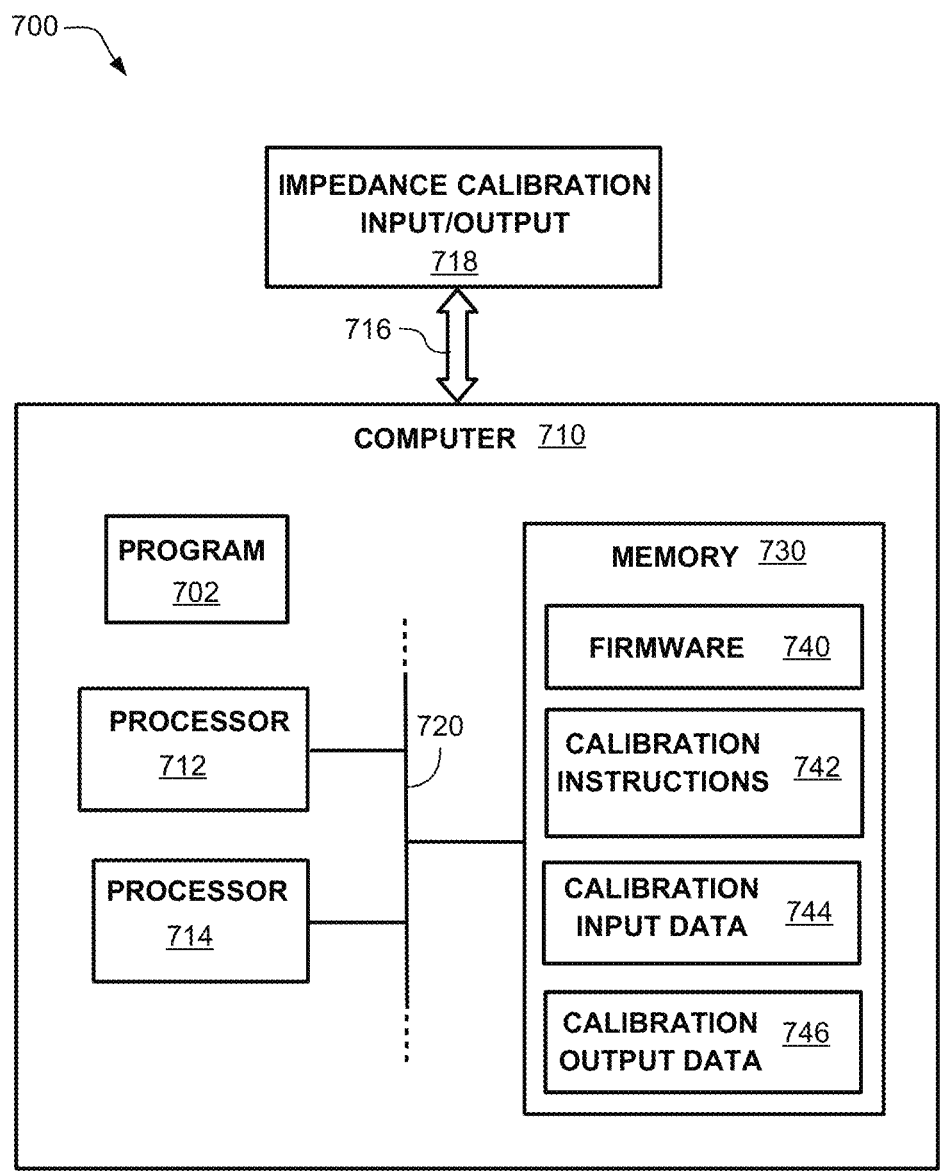
FIG. 7 is a block diagram illustrating a computer-based system that can embody methods and structures of the disclosure.

FIG. 7 illustrates example computing system 700 comprising impedance calibration input/output 718 (hereinafter, "input/output 718") coupled by interface 716 to computer 710. In embodiments, computer 710 can be any form of computer and/or computing device comprising a processor and a memory, and input/output 718 can comprise input data, output data, a source of input data, and/or a recipient of output data, associated with a method, apparatus, and/or application of the disclosure. For example, in embodiments input data of input/output 718 can comprise impedance values of segments of a net, a retention time of a PCM cell included in a segment, a tuning range, drift rates of circuits in an impedance tuning system and/or a net, and/or calibration and/or suspension intervals of an impedance tuning system. Output data of input/output 718, in an embodiment, can comprise, for example, data similar to input data of input/output 718, an output of a TDR analysis, operating states of elements of an impedance tuning system and/or net, and/or outputs of a method such as 600 of FIG. 6.

In embodiments, interface 716 can enable computer 710 to, for example, receive or otherwise access input data, included in input/output 718, and/or to present or otherwise communicate output data, included in input/output 718. In embodiments, interface 716 can comprise, and/or couple computer 710 to, for example, signal lines, a communications interface, a network (e.g., an electronic net), and/or a storage medium, such as a disk drive. Interface 716 can be configured to enable input from, and/or to present output data to elements of an impedance tuning system. It would be apparent to one of ordinary skill in the art that interface 716 can be any of a variety of interface types or mechanisms suitable for a computer, or a program operating in a computer, to receive or otherwise access input data, and/or to present or otherwise communicate output data, included in input/output 718.

FIG. 7 further illustrates computer 710 having processors 712 and 714 and memory 730. In embodiments processors 712 and/or 714 can be a single processor or a multi-threaded processor, a processing core of a processor, a general purpose or a special purpose processor, a co-processor, or any of a variety of processing devices that can execute computing instructions. In embodiments a memory can be a cache memory, a main memory, a flash memory, or a combination of these or other varieties of electronic devices capable of storing information and, optionally, making the information, or locations storing the information within the memory, accessible to a processor. In embodiments processors of a computing device, such as computer 710, can be coupled to the memory. For example, in FIG. 7 processors 712 and 714 couple to memory 730 by means of memory interface 720. In embodiments, such an interface can be, for example, a memory bus or a point-to-point connection between the processor and the memory.

In embodiments, a computing device can include instructions executable by one or more processors (or, processing elements, such as threads of a processor). The instructions can be a component of one or more programs and the programs, or the instructions, can be stored in, and/or utilize, one or more memories of a computing device. For example, in FIG. 7 computer 710 includes program 702 and instructions of program 702 can be stored in memory 730 (e.g., as firmware 740). In an embodiment a program, such a 702, can be a program that executes on processor 712 and/or 714 to perform operations of example methods 500 of FIGS. 5 and/or 600 of FIG. 6. While not shown in FIG. 7, a computing device can include a plurality of programs, such as 702, and the programs can interoperate to perform operations and/or methods of the disclosure.

A program can be embodied as firmware (e.g., BIOS in a desktop computer, or a hypervisor) and the firmware can execute on one or more processors and, optionally, can use a memory, such as a memory included in, and/or coupled to, the computing device. For example, computer 710 includes firmware 740, which can comprise instructions executable by processors 712 and/or 714 to manage operations of computer 710 and/or elements of an impedance control system. In another example, as illustrated in FIG. 7 memory 730 includes calibration instructions 742, which can include instructions executable by processors 712 and/or 714 to perform operations of methods and/or operations of the disclosure.

In embodiments, a memory of, and/or coupled to, a computing device can store input data, such as can be used by the instructions. For example, as also shown in FIG. 7, memory 730 includes calibration input data 744. In an embodiment, calibration input data 744 can include data (e.g., data included in input/output 718) used by calibration instructions 742 in performing operations and/or of methods of the disclosure. In another example, in embodiments calibration input data 744 can include impedance values associated with a net, one or more segments of a net, and/or to apply to one or more impedance devices included in a net.

Similarly, in an embodiment a memory of, and/or coupled to, a computing device can store output data, such as the results of executing the instructions programs by processors 712 and/or 714. As illustrated in FIG. 7, memory 730 includes calibration output data 746, which can comprise, in an embodiment, the results of executing instructions, such as instructions included in firmware 740, programs 704 and/or 706, and/or calibration instructions 742 performing methods and/or operations of the disclosure.

The example of computing system 700 is not intended to limit embodiments. It would be apparent to one of ordinary skill in the art that in embodiments, computing system 700 can include a plurality of computers, such as 710, and/or interfaces, such as 716, not shown in FIG. 7 and can include other elements or components, such as storage and/or IO devices. It would be evident to one of ordinary skill in the art to include a variety of devices interconnected in a variety of manners in a computing device and/or computing system embodying aspects and features of the disclosure. It would be further apparent to one of ordinary skill in the art that a computing device, and/or computing system, embodying aspects and features of the disclosure can be any of a variety of computing devices having processors and, optionally, memories and/or programs.

The flowchart and block diagrams in the Figures illustrate the architecture, functionality, and operation of possible implementations of systems and methods, according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system, the system comprising:
   a first segment of an electronic net, the first segment comprising, an electronic circuit device and at least one signal line electrically coupling the circuit device and the net;
   an interval timer;
   a variable impedance device electrically coupled to the first segment; and,
   an impedance tuning system, wherein the impedance tuning system is configured to:
   activate the interval timer to expire after a calibration interval;
   in response to the interval timer expiring after the calibration interval, perform a first impedance analysis of the net;
   calibrate, based on a result of the first impedance analysis, the variable impedance device to have a first impedance; and,
   re-activate the interval timer to expire after the calibration interval.

2. The system of claim 1, wherein the variable impedance device comprises a phase-change material (PCM); and, wherein the impedance tuning system configured to calibrate the variable impedance device comprises the impedance tuning system further configured to modify the PCM to produce the first impedance of the variable impedance device.

3. The system of claim 1, wherein the variable impedance device comprises a PCM; and, wherein the calibration interval corresponds to a retention time of the PCM.

4. The system of claim 1, wherein the calibration interval corresponds to a drift rate.

5. The system of claim 1, wherein the system further comprises a monitor circuit configured to determine a drift rate;
   wherein the impedance tuning system is further configured to modify the calibration interval based on the drift rate determined by the monitor circuit; and,
   wherein the impedance tuning system configured to re-activate the interval timer comprises the impedance tuning system further configured to re-activate the interval timer using the modified calibration interval.

6. The system of claim 1, wherein the variable impedance device comprises a digital potentiometer.

7. The system of claim 1, wherein the impedance tuning system further comprises a time-domain reflectometry (TDR) circuit electrically coupled to the net; and,
   the impedance tuning system configured to perform the first impedance analysis comprises the impedance tuning system further configured to perform a TDR analysis using the TDR circuit.

8. The system of claim 7, wherein the impedance tuning system is further configured to suspend, on a second segment of the net, in association with at least one of the impedance tuning system performing the first impedance analysis and the impedance tuning system calibrating the variable impedance device, operational transmissions of the net.

9. The system of claim 1, wherein the impedance tuning system is further configured to perform, based on the calibrating the variable impedance device to have the first impedance, a second impedance analysis of the net.

10. The system of claim 9, wherein the impedance tuning system is further configured to calibrate, based on a result of the second impedance analysis, the variable impedance device to have a second impedance.

11. A method, the method comprising:
    activating, by an impedance tuning system, an interval timer to expire after a calibration interval;
    performing, by the impedance tuning system, based on the interval timer expiring after the calibration interval, a first impedance analysis of an electronic net;
    calibrating, by the impedance tuning system, based on a result of the first impedance analysis, a variable impedance device, electrically coupled to the net, to have a first impedance; and,
    re-activating, by the impedance tuning system, the interval timer to expire after the calibration interval.

12. The method of claim 11, the method further comprising determining, by the impedance tuning system, a drift rate and modifying, by the impedance tuning system, the calibration interval based on the drift rate; and,
    wherein the impedance tuning system re-activating the interval timer comprises the impedance tuning system re-activating the interval timer using the modified calibration interval.

13. The method of claim 11, wherein the first impedance analysis comprises a time-domain reflectometry (TDR) analysis.

14. The method of claim 13, wherein the method further comprises suspending, on a segment of the net, by the impedance tuning system, in association with at least one of the performing the first impedance analysis and the calibrating the variable impedance device, operational transmissions of the net.

15. The method of claim 11, the method further comprising performing, by the impedance tuning system, based on the calibrating the variable impedance device to have the first impedance, a second impedance analysis of the net.

16. The method of claim 15, the method further comprising calibrating, by the impedance tuning system, based on a result of the second impedance analysis, the variable impedance device to have a second impedance.

17. The method of claim 15, wherein at least one of the first and the second impedance analysis comprises a TDR analysis.

18. The method of claim 11, wherein the variable impedance device comprises at least one of a phase-change material (PCM) and a digital potentiometer.

19. The method of claim 18, wherein the impedance tuning system calibrating the variable impedance device comprises the impedance tuning system modifying the PCM to produce the first impedance of the variable impedance device.

20. The method of claim 18, wherein the calibration interval corresponds to a retention time of the PCM.

\* \* \* \* \*